(12) United States Patent
Giron et al.

(10) Patent No.: US 11,097,513 B2
(45) Date of Patent: Aug. 24, 2021

(54) LAMINATED GLASS PANE AND USE THEREOF

(75) Inventors: Jean-Christophe Giron, Eupen (BE); Annabelle Andreau-Wiedenmaier, Aachen (DE); Dang Cuong Phan, Aachen (DE)

(73) Assignee: SAGE ELECTROCHROMICS, INC., Faribault, MN (US)

( * ) Notice: Subject to any disclaimer, the term of this patent is extended or adjusted under 35 U.S.C. 154(b) by 693 days.

(21) Appl. No.: 13/260,210

(22) PCT Filed: Jun. 10, 2010

(86) PCT No.: PCT/EP2010/058167
§ 371 (c)(1),
(2), (4) Date: Sep. 23, 2011

(87) PCT Pub. No.: WO2010/145986
PCT Pub. Date: Dec. 23, 2010

(65) Prior Publication Data
US 2012/0017975 A1  Jan. 26, 2012

(30) Foreign Application Priority Data
Jun. 15, 2009 (DE) .................... 10 2009 025 972.4

(51) Int. Cl.
*B32B 17/10* (2006.01)
*H01L 31/0392* (2006.01)

(52) U.S. Cl.
CPC .... *B32B 17/10036* (2013.01); *B32B 17/1055* (2013.01); *B32B 17/1077* (2013.01);
(Continued)

(58) Field of Classification Search
CPC ........ B32B 17/10036; B32B 17/10174; B32B 17/1055; B32B 17/1077; B32B 17/10788;
(Continued)

(56) References Cited

U.S. PATENT DOCUMENTS 2,640,904 A  6/1953 Gaiser
3,317,710 A  5/1967 Boicey et al.
(Continued)

FOREIGN PATENT DOCUMENTS

CN  1950201 A  4/2007
CN  101405134 A  4/2009
(Continued)

OTHER PUBLICATIONS

Peter L. Bocko, American Ceramic Society Bulletin, vol. 85, 2006, pp. 35-36.*
(Continued)

*Primary Examiner* — Callie E Shosho
*Assistant Examiner* — Krupa Shukla
(74) *Attorney, Agent, or Firm* — Abel Schillinger, LLP; Robert N Young

(57) ABSTRACT

A laminated glass pane is described including a) a substrate glass, b) at least one layer structure applied to the substrate glass, c) at least one polymer layer applied to the layer structure, d) a cover glass on the polymer layer, wherein the mean coefficient of thermal expansion of the substrate glass is at most $18 \times 10^{-7}$ K$^{-1}$ greater than or at most $18 \times 10^{-7}$ K$^{-1}$ less than the mean coefficient of thermal expansion of the cover glass, and in the temperature range from $-40°$ C. to $+90°$ C., the maximum mechanical stress of the laminated glass pane is less than or equal to 7 MPa. Uses of the laminated glass pane are also described.

19 Claims, 3 Drawing Sheets

Figure 1:
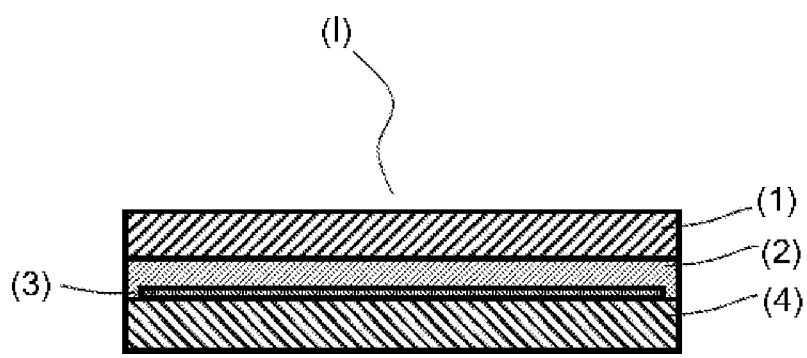

(52) U.S. Cl.
 CPC .... *B32B 17/10174* (2013.01); *H01L 31/0392* (2013.01); *Y02E 10/50* (2013.01); *Y10T 428/24967* (2015.01)

(58) Field of Classification Search
 CPC ........ B32B 17/10761; B32B 17/10752; B32B 17/10743; B32B 17/06; B32B 27/40; B32B 27/306; B32B 27/304; B32B 27/308; B32B 2307/204; B32B 2313/02; B32B 2551/00; B32B 2551/08; B32B 2605/006; Y02B 80/50; Y02B 80/20; Y02B 80/22; E06B 2009/2464; E06B 2009/247; E06B 2009/24; B60R 1/088; B60R 1/083; C03C 3/064; C03C 3/089; C03C 27/10; C03C 2201/08; C03C 2201/10; C03C 2217/21; C03C 2217/28; C03C 2217/256; C03C 2217/94; H01L 31/039; H01L 31/0392; Y02E 10/50; Y10T 428/24967
 USPC .................. 428/412, 423.1, 425.6, 426, 215; 136/252, 243; 427/108, 164, 165, 123, 427/162; 156/99; 501/49, 47, 53, 55, 58, 501/65, 75, 77; 359/265, 275, 273, 245, 359/288, 585
 See application file for complete search history.

(56) References Cited

U.S. PATENT DOCUMENTS

| | | | |
|---|---|---|---|
| 5,352,504 A * | 10/1994 | Boulanger | G02F 1/1533 349/16 |
| 5,412,492 A * | 5/1995 | Zammit et al. | 349/1 |
| 5,459,110 A * | 10/1995 | Brix | 501/67 |
| 5,668,663 A * | 9/1997 | Varaprasad | B32B 17/06 359/265 |
| 6,355,125 B1 | 3/2002 | Tahon et al. | |
| 6,713,180 B1 * | 3/2004 | Torr et al. | 428/410 |
| 6,747,779 B1 | 6/2004 | Morin et al. | |
| 6,829,114 B2 * | 12/2004 | Sakamoto | 359/580 |
| 7,110,157 B2 * | 9/2006 | Beteille et al. | 359/265 |
| 2002/0006508 A1 * | 1/2002 | Shichiri et al. | 428/339 |
| 2002/0196519 A1 * | 12/2002 | Elkadi et al. | 359/265 |
| 2006/0127679 A1 | 6/2006 | Gulati et al. | |
| 2009/0181203 A1 * | 7/2009 | Valentin | B32B 17/10036 428/38 |
| 2009/0315057 A1 * | 12/2009 | Konishi et al. | 257/98 |
| 2009/0323157 A1 * | 12/2009 | Valentin | G02F 1/15245 359/265 |
| 2010/0028585 A1 * | 2/2010 | Shimatani | 428/38 |
| 2010/0151210 A1 * | 6/2010 | Shimatani | A47F 3/0434 428/192 |
| 2010/0163107 A1 * | 7/2010 | Sakamoto et al. | 136/259 |
| 2010/0193024 A1 | 8/2010 | Karpinski et al. | |

FOREIGN PATENT DOCUMENTS

| | | |
|---|---|---|
| DE | 10317265 A1 | 11/2004 |
| DE | 69916683 T2 | 4/2005 |
| DE | 10 2006 042 538 A1 | 3/2008 |
| EP | 0939060 B1 | 4/2004 |
| EP | 0 831 360 B1 | 9/2007 |
| EP | 2 151 884 A1 | 2/2010 |
| JP | 2003007453 A | 1/2003 |
| JP | 2003500534 A | 1/2003 |
| JP | 2008282783 A | 11/2008 |
| WO | 0071777 A1 | 11/2000 |
| WO | 10 2004 022 008 A1 | 12/2004 |
| WO | 2007/093823 | 8/2007 |
| WO | 2008149793 A1 | 12/2008 |
| WO | 2009047223 A2 | 4/2009 |

OTHER PUBLICATIONS

PCT International Search Report issued for PCT Application No. PCT/EP2010/058167 filed on Jun. 10, 2010 in the name of Saint-Gobain Glass France (English + German).
Chinese Office Action for Application No. 201080026474 dated Nov. 22, 2013.
Japanese Office Action for Application No. 2012-514475 dated Nov. 19, 2013.

* cited by examiner

US 11,097,513 B2

LAMINATED GLASS PANE AND USE THEREOF

CROSS REFERENCE TO RELATED APPLICATIONS

The present application is the US national stage of International Application PCT/EP2010/058167 filed on Jun. 10, 2010, which, in turn, claims priority to German Patent Application 10 2009 025 972.4 filed on Jun. 15, 2009.

The present invention relates to a new laminated glass pane with a layer structure.

The present invention further relates to a new use of a laminated glass pane.

Patent application DE 10 2006 042 538 A1 discloses a laminated glass, comprising a thin glass with a thickness less than or equal to 1.5 mm. The laminated glass has a functional coating and is laminated with a number of other glasses and polymer layers. The thicknesses and materials of the glasses and adhesion promoting layers are designed such that shear forces at the glass/bonding material interface through the action of an external force or through temperature changes are compensated.

From US 2006/0127679 A1, a glass laminate with outer glass layers and a glass core is known, wherein the outer glass layers have a first coefficient of thermal expansion and the transparent glass core has a second, higher coefficient of thermal expansion. The outer glass layers have mechanical compressive stresses greater than 6.9 MPa. The glass core has tensile stresses of less than 27.6 MPa, preferably less than 6.9 MPa. The structure includes at least three glass layers. By means of preferred combinations of coefficients of thermal expansion, preferred mechanical stresses can be obtained in the glass laminate.

There, it is, however, necessary to use thermally pretreated glass, glass with unconventional thicknesses and/or more than two glass panes to selectively adjust the mechanical stresses.

The object of the present invention is to provide an improved laminated glass that no longer has the disadvantages of conventional laminated glasses. In particular, the mechanical stresses should be minimized in a simple manner in the laminated glass pane. Deformations, delaminations, or glass breakage of the laminated glass pane, e.g., due to temperature changes or the action of external forces, should be prevented.

A further object of the present invention is to provide a new use of the laminated glass pane.

These and further objects are accomplished according to the proposal of the invention of the structure with the characteristics of the independent claim. Advantageous embodiments of the invention result from the characteristics of the subclaims.

According to the invention, a laminated glass pane is provided, comprising
  a) a substrate glass with a thickness of 0.3 mm to 25 mm,
  b) at least one layer structure applied to the substrate glass,
  c) at least one polymer layer with a layer thickness of 0.2 mm to 10 mm applied to the layer structure,
  d) a cover glass with a thickness of 1.3 mm to 25 mm on the polymer layer,
  wherein the mean coefficient of thermal expansion of the substrate glass is at most $18 \times 10^{-7}$ K$^{-1}$ greater than or at most $18 \times 10^{-7}$ K$^{-1}$ less than the mean coefficient of thermal expansion of the cover glass and in the temperature range from −40° C. to +90° C., the maximum mechanical stress of the laminated glass pane is less than or equal to 7 MPa.

In buildings and motor vehicles, laminated glazings with layer structures, in particular with electrically active layer structures, are increasingly used. For protection against external influences, in particular against external mechanical forces, temperatures in the range of usually −40° C. to 90° C., and moisture as well as for galvanic separation of the electrically active layer structures from the environment, the layer structures are located on the internal faces of the laminated glazings, on the interface between an adhesion promoting polymer layer and the glass panes.

The requirements concerning coated laminated glass panes in motor vehicles are, for example, known from ECE-R 43 (Rule 43: Uniform Provisions concerning the Approval of Safety Glazing Materials and their Installation on Vehicles, 2004). Requirements concerning laminated glass panes in the building industry are described in DIN EN 12543. The requirements for the design approval of coated laminated glasses are described, for example, in standards for thin-film photovoltaic modules, such as DIN EN 61646 and DIN EN 61250.

It is known that the glass panes of the laminated glass panes are preferably also used as a substrate for the layer structure. The glass pane that serves as the substrate for the layer structure is referred to as substrate glass. The other glass pane in the laminated glass is referred to as cover glass.

Laminated glass panes are usually exposed to a temperature range from −40° C. to 90° C. Within the temperature range, the mechanical stresses in a laminated glass must not exceed a critical mechanical stress.

For laminated glass panes with an electrically active layer structure, different maximum mechanical stresses are permissible depending on the properties of the layer structure. Determining properties for the maximum mechanical stresses in laminated glass panes are, in particular:
  a) the mechanical residual stresses and layer thicknesses of individual layers of the layer structure,
  b) the mechanical residual stress and layer thickness of the entire layer structure,
  c) the bonding of the individual layers of the layer structure among each other, and
  d) the bonding of the layer structure with the substrate glass and/or the polymer layer.

The maximum mechanical stresses are also determined by the entire laminate structure and also the assembly device in view of the danger of deformations and glass breakage due to external forces.

Preferably, the mean coefficient of thermal expansion of the cover glass is $25 \times 10^{-7}$ K$^{-1}$ to $80 \times 10^{-7}$ K$^{-1}$ and the mean coefficient of thermal expansion of the substrate glass is $25 \times 10^{-7}$ K$^{-1}$ to $80 \times 10^{-7}$ K$^{-1}$. Critical mechanical stresses appear in particular at the time of a temperature change if the mean coefficients of thermal expansion of the cover glass, of the substrate glass, and of the polymer layers are not appropriately attuned to each other.

In a preferred embodiment, the mean coefficient of thermal expansion of the substrate glass is at most $12 \times 10^{-7}$ K$^{-1}$ greater than or at most $12 \times 10^{-7}$ K$^{-1}$ less than the mean coefficient of thermal expansion of the cover glass, and the maximum mechanical stresses of the laminated glass pane in the temperature range from −40° C. to +90° C. are less than or equal to 7 MPa.

In an alternative embodiment, the mean coefficient of thermal expansion of the substrate glass is at most $6 \times 10^{-7}$ K$^{-1}$ greater than or at most $6 \times 10^{-7}$ K$^{-1}$ less than the mean coefficient of thermal expansion of the cover glass, and the maximum mechanical stresses of the laminated glass pane in the temperature range from −40° C. to +90° C. are less than or equal to 7 MPa.

In the structure according to the invention, the mean coefficients of thermal expansion of the cover glass and of the substrate glass are largely adapted to the requirements of the layer structures. In particular, shear forces on the interface of the substrate glass with the polymer layer which can damage the layer structure are avoided.

Mechanical stresses in the glass panes can be measured with polariscopes or polarimeters that use a special filter arrangement to make mechanical stresses visible through color shifts or intensity differences. Suitable measuring instruments are, for example, the "Edge Stress Master" or the "Large Field Strain Viewer" from the company SHARPLESS STRESS ENGINEERS LTD or the "GASP" from the company STRAINOPTICS INC.

Mechanical residual stresses in the layer structures can be calculated, for example, with known methods from measurements using x-ray diffractometry or by means of strain gauges on the layer.

The mechanical stresses in the laminated glass panes vary with different coefficients of thermal expansion due to seasonal, time-of-day, and use-based fluctuations in the ambient temperatures, as well as the Joule losses in the layer structure. When the glass panes, polymer layers, and layer structures have wide variances in the coefficient of thermal expansion, thermal cycles cause an increase in the mechanical stresses of the glass panes and layer structures of the laminated glass pane.

Mechanical stresses also result, in particular, in deformations of the laminated glass panes. Maximum deflection can be used as a parameter for measuring deformation. Deflection indicates the maximum depth of a convex shape of the laminated glass pane or height of a concave shape of the laminated glass pane, relative to an imaginary flat plane generated by the 4 corner points of the area.

In a preferred embodiment, the laminated glass pane has a maximum deflection less than or equal to 16 mm in the temperature range from −40° C. to +90° C.

The coefficient of thermal expansion with the unit 1/K (CTE) is a temperature dependent variable. The mean coefficient of thermal expansion for glass is calculated according to ISO 7991:1987 and takes into account the typical temperature behavior from 30° C. to 300° C.

The layer structures can be electrically wired and active. In particular, the layer structures can have an electrochromic, photovoltaic, light emitting, and/or heating function. Typically, layer structures are made of multiple individual layers, in particular thin films with a layer thickness of less than 5 μm.

Layer structures with an electrochromic function contain an active layer surrounded by transparent electrodes. Suitable layer structures are known, for example, from EP 0 831 360 B1 and U.S. Pat. No. 6,747,779 B1. Through application of an external voltage, charge carriers are transported into the active layer with the result that the active layer changes its transparency for visible light. Then, when a reversed voltage is applied, the charge carrier migration is reversed such that the original transparency is restored. The thicknesses of the electrochromic layer structure are preferably 500 nm to 1 mm.

Light emitting layer structures are based on thin-film systems or films made of semiconductor material, in particular organic light emitting diodes and electroluminescent materials that emit light in defined wavelength ranges after application of an electrical voltage. The light emitting layer structures have layer thicknesses from 500 nm to 2 mm.

Layer structures with a photovoltaic function on glass substrates are, preferably, thin-film solar cells. Thin-film solar cells are constructed from thin photoactive layers in the range from 100 nm to 20 μm layer thickness. The photoactive layers are contacted via thin-film electrodes. The photoactive layers contain semiconductors and compound semiconductors, electrodes, transparent conductive oxides or metal layers. Photoactive layers are made, for example, substantially from silicon with an amorphous to monocrystalline structure, from the compound semiconductor cadmium telluride, or, in particular, from compounds of copper, indium, gallium, selenium, or sulfur. Dye-sensitized and organic solar cells constitute a further group and are likewise used in thin-film photovoltaics. Through combination of different semiconductors, in particular, in a stacked structure, electrical efficiency can be increased.

Layer structures with a heating function on a surface area include at least one conductive coating, preferably transparent individual layers with a defined electrical sheet resistance. By applying an electrical voltage to two opposing edge regions of the surface area, a heating effect is obtained through Joule heat. The transparent heating layers contain, in particular, silver with a layer thickness from 5 nm to 50 nm or conductive transparent oxides such as zinc oxide, tin oxide, or indium-tin oxide.

The mechanical stresses of the laminated glass pane are minimized for areas >0.5 m$^2$. In particular, in the case of the use according to the invention in the building industry with typical sizes of 1.5×2.5 m$^2$, 1.1×1.3 m$^2$, and 0.8×0.6 m$^2$ or in the glazing of motor vehicles, this is advantageous.

Motor vehicles are land, water, and air motor vehicles. The invention is, in particular, advantageously used in automobiles.

In the building industry, the invention is, in particular, advantageous in architectural glazing, for interior decoration of buildings, but also in weather-exposed outdoor areas.

In a preferred embodiment, the cover glass has, on the side facing the polymer layer, a passive layer for adjustment of the transmission of thermal radiation. The passive layer preferably contains doped metal oxides, in particular $SnO_2$, ZnO, thin transparent metal layers, in particular silver, metal oxides and/or silicon nitride, as well as combinations thereof. By means of suitable layer arrangements, the reflection behavior and absorption behavior as well as the emissivity of the layers in a defined wavelength range can be adapted to the requirements of the laminated glass pane with a layer structure.

Substantial requirements of the cover glass and of the substrate glass are their coefficient of thermal expansion and corrosion stability. In particular, the alkali element oxides and boroxides significantly affect the properties. Simply put, an increase in the $B_2O_3$ content in the cover glass or substrate glass generally results in a lowering of the coefficient of thermal expansion. An increase in the alkali element oxides, such as $Li_2O$, $Na_2O$, $K_2O$ in the glass composition generally results in an increase in the mean coefficient of thermal expansion. Small weight proportions of alkali element oxides increase corrosion stability, particularly under the influence of moisture and heat.

The cover glass and the substrate glass contain 0 wt.-% to 18 wt.-%, preferably 0 wt.-% to 16 wt.-%, alkali element oxides and 5 wt.-% to 20 wt.-% $B_2O_3$. Particularly preferably, the cover glass and the substrate glass contain 0.1 wt.-% to 6 wt.-% alkali element oxides and 8 wt.-% to 15 wt.-% $B_2O_3$.

The requirements with regard to the mean coefficients of thermal expansion are thus adapted.

The at least one polymer layer as an adhesion-promoting layer between the substrate glass, layer structure, and cover glass preferably contains polyvinyl butyral (PVB), polyurethane (PU), polypropylene (PP), polyacrylate, polyethylene (PE), polycarbonate (PC), polymethyl methacrylate, polyvinyl chloride, polyacetate resin, casting resins, acrylates, and/or ethylene vinyl acetate (EVA), as well as their copolymers and/or mixtures thereof.

The explanation of the invention with reference to the drawings according to the structure and mechanism of action of the invention presented follows.

The figures depict

Figure 2:
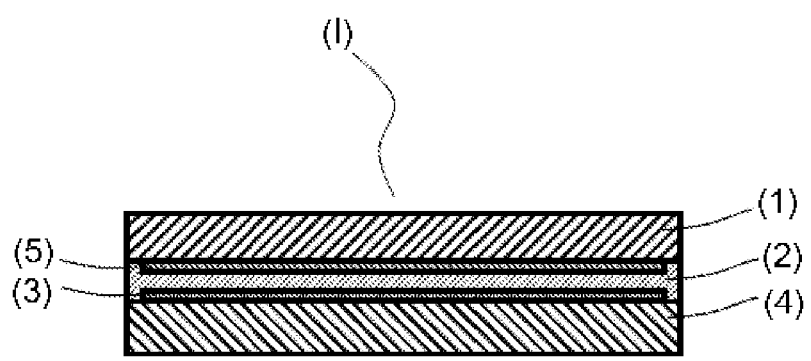
Figure 3:
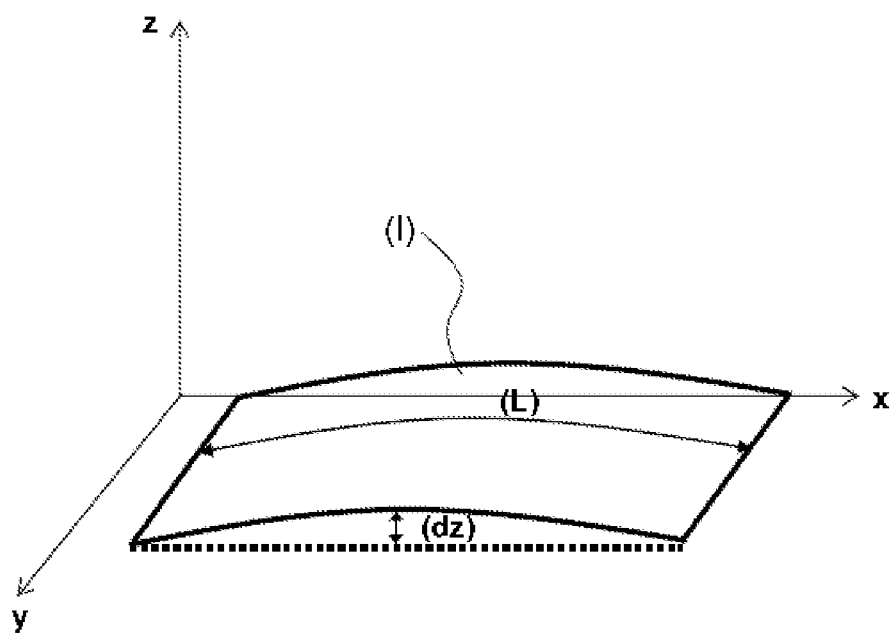

FIG. 1 a laminated glass pane with a layer structure according to the invention, FIG. 2 a preferred embodiment of the laminated glass pane, FIG. 3 a spherical depiction of a laminated glass pane.

FIG. 1 depicts an exemplary embodiment of the laminated glass pane (I) according to the invention. As a layer structure (3), a sequence of layers with an electrochromic function was applied to a substrate glass (4). The thickness of the layer structure (3) was 0.5 to 2 μm. The substrate glass (4) was a borosilicate glass with a thickness of 1.5 mm. The mean coefficient of thermal expansion was $44\times10^{-7}$ K$^{-1}$, measured according to DIN ISO 7991. As a cover glass (1), an optimized borosilicate glass with a thickness of 6 mm and a mean coefficient of thermal expansion of $50\times10^{-7}$ K$^{-1}$ was used. The mean coefficient of thermal expansion of the substrate glass (4) was $6\times10^{-7}$ K$^{-1}$ less than the mean coefficient of thermal expansion of the cover glass (1). As a polymer layer (2) for the laminate structure between the layer structure (3) and the cover glass (1), a polyurethane film from the company Huntsmann, Salt Lake City, with a coefficient of thermal expansion of roughly $800\times10^{-7}$ K$^{-1}$ and a thickness of 0.76 mm was used. The area of the laminated glass pane (I) was 1.5 m×2.5 m. The mechanical stresses in the laminated glass pane (I) were calculated with a simulation program ABAQUS V. 6.8, from the company Dassault Systems. The calculations of the maximum stresses and deflections were based on a temperature range from −40° C. to 90° C. The maximum mechanical stresses in the laminated glass pane (I) were calculated at 7 MPa; the resultant maximum deflection was 7 mm. the resultant stresses were, in all areas, less than 7 MPa. In particular, in the area of the layer structure (3), no mechanical stresses that resulted in delamination of the layer structure appeared.

A comparative example according to the prior art relates to a laminated glass pane that differs as follows from the laminated glass panes (I) according to the invention. The substrate glass (4) was a borosilicate glass with a thickness of 6 mm. The mean coefficient of thermal expansion was $32\times10^{-7}$ K$^{-1}$, measured according to DIN ISO 7991. As a cover glass (1), a soda lime glass with a thickness of 10 mm and a mean coefficient of thermal expansion of $90\times10^{-7}$ K$^{-1}$ was used. The mean coefficient of thermal expansion of the substrate glass (4) was $58\times10^{-7}$ K$^{-1}$ less than the mean coefficient of thermal expansion of the cover glass (1). The maximum mechanical stresses within the laminated glass pane (I) were calculated at 35 MPa. The resultant maximum deflection was 67 mm. The resultant stresses are greater than 7 MPa in critical areas. In particular, on the internal surfaces of the layer structure (3), tensile and compressive stresses and, consequently, shear forces, appeared that resulted in delamination of the layer structure (3) at the interfaces.

FIG. 2 depicts a preferred embodiment of the invention. On the cover glass (1) there is a passive layer (5). The passive layer (5) contains an infrared radiation reflecting coating. The mechanical properties are roughly identical to the exemplary embodiment of FIG. 1.

FIG. 3 is a spherical depiction of a laminated glass pane (I). (L) is the longest edge of the laminated glass pane (I). The maximum deflection (dz) of the laminated glass pane (I) should be less than or equal to 1/150 of (L) in order to prevent delamination, deformation, or glass breakage of the laminated glass pane (I).

Table 1 shows other exemplary embodiments as preferred configurations and comparative examples according to the prior art. The laminated glass panes had an area of 1.5×2.5 m$^2$. (CTE) denotes the mean coefficients of thermal expansion and (d) the thickness of the polymer layers, or the glass panes. The simulation results of the maximum mechanical stresses within the layer structure are denoted as Sigma. The deflection (dz) indicates the maximum depth of a convex shape or height of a concave shape relative to a flat plane. A temperature range from −40° C. to +90° C. was considered for the determination of the maximum stresses. For all examples, a 0.76 mm thick polyurethane film was used as a polymer layer (2). The results in Table 2 show other embodiments with laminated glass panes with an area of 1.1×1.3 m$^2$.

TABLE 1

| | | Substrate Glass (4) | | Cover Glass (1) | | Amount of Difference CTE(1) − | Result | |
|---|---|---|---|---|---|---|---|---|
| No. | Example | d [mm] | CTE [$10^{-7}$K$^{-1}$] | d [mm] | CTE [$10^{-7}$K$^{-1}$] | CTE(4) [$10^{-7}$K$^{-1}$] | Sigma [MPa] | dz [mm] |
| 1. | Control | 6 | 32 | 10 | 90 | 58 | 35 | 67 |
| 2. | Control | 6 | 44 | 10 | 90 | 46 | 27 | 53 |
| 3. | Embodiment | 6 | 32 | 10 | 37 | 5 | 7 | 12 |
| 4. | Embodiment | 6 | 44 | 10 | 50 | 6 | 7 | 12 |
| 5. | Embodiment | 1.5 | 44 | 4 | 50 | 6 | 7 | 13 |
| 6. | Embodiment | 1.5 | 44 | 6 | 50 | 6 | 7 | 7 |
| 7. | Embodiment | 6 | 32 | 10 | 44 | 12 | 7 | 14 |

TABLE 2

| No. | Example | Substrate Glass (4) d [mm] | Substrate Glass (4) CTE $[10^{-7}K^{-1}]$ | Cover Glass (1) d [mm] | Cover Glass (1) CTE $[10^{-7}K^{-1}]$ | Amount of Difference CTE(1) − CTE(4) $[10^{-7}K^{-1}]$ | Result Sigma [MPa] | Result dz [mm] |
|---|---|---|---|---|---|---|---|---|
| 8. | Embodiment | 6 | 44 | 1.5 | 32 | 12 | 7 | 6.1 |
| 9. | Embodiment | 1.5 | 44 | 6 | 32 | 12 | 7 | 8.9 |

In the comparative examples 1 and 2, high mechanical stresses of 27 and 35 MPa and deflections of 53 and 67 mm appeared, in particular, on the inner surfaces of the layer structure (3). The resulting shear forces resulted in delamination of the layer structure at the interfaces.

In the exemplary embodiments 3 through 9 according to the invention, mechanical stresses of at most 7 MPa and deflections of 7 mm to 14 mm appeared. In particular in the area of the layer structure (3), no mechanical stresses appeared that resulted in delamination of the layer structure (3), deformation, or breakage of the laminated glass pane (I).

The results of Tables 1 and 2 demonstrate that for the laminated glass panes (I) with layer structure (3) according to the invention substantially reduced maximum mechanical stresses develop. On the whole, the probability of deformations, delaminations, and glass breakage of the laminated glass pane (I) as a result of temperature changes and/or external forces is minimized.

LIST OF REFERENCE CHARACTERS (I) laminated glass pane
(1) cover glass
(2) polymer layer
(3) layer structure
(4) substrate glass
(5) passive layer
(L) length of the longest edge of the laminated glass pane
(dz) maximum deflection of the laminated glass pane

The invention claimed is:

1. A laminated glass pane, comprising:
a substrate glass having a thickness of 0.3 mm to 25 mm;
at least one layer structure applied to the substrate glass, wherein the at least one layer structure contains an electrochromic layer system, wherein the electrochromic layer system comprises an active layer surrounded by one or more transparent conductive electrodes,
at least one polymer layer applied to the at least one layer structure, the at least one polymer layer having a layer thickness of 0.2 mm to 10 mm; and
a cover glass on the at least one polymer layer, the cover glass having a thickness of 1.3 mm to 25 mm,
wherein:
an absolute value of a difference between a mean coefficient of thermal expansion of the substrate glass and a mean coefficient of thermal expansion of the cover glass is greater than zero and at most $18 \times 10^{-7}$ K$^{-1}$; and
the maximum mechanical stress of the laminated glass pane in a temperature range from −40° C. to +90° C. is less than or equal to 7 MPa.

2. The laminated glass pane according to claim 1, wherein maximum deflection in the temperature range from −40° C. to +90° C. of the laminated glass pane is less than or equal to 16 mm.

3. The laminated glass pane according to claim 1, wherein the substrate glass and the cover glass contain 0 wt.-% to 18 wt.-% alkali element oxides and 5 wt.-% to 20 wt.-% $B_2O_3$.

4. The laminated glass pane according to claim 3, wherein the substrate glass and the cover glass contain 0.1 wt.-% to 6 wt.-% alkali element oxides and 8 wt.-% to 15 wt.-% $B_2O_3$.

5. The laminated glass pane according to claim 1, wherein the at least one polymer layer contain polyvinyl butyral (PVB), polyurethane (PU), polypropylene (PP), polyacrylate, polyethylene (PE), polycarbonate (PC), polymethyl methacrylate, polyvinyl chloride, polyacetate resin, casting resins, acrylates, ethylene vinyl acetate (EVA) or copolymers and-/-or mixtures thereof.

6. The laminated glass pane according to claim 1, wherein the cover glass additionally comprises a passive layer, containing metal oxides, silver, silicon nitrides, silicon oxides or combinations thereof.

7. The laminated glass pane according to claim 1, wherein the at least one layer structure contains at least one electrically conducting and-/-or semiconducting layer.

8. The laminated glass pane according to claim 1, wherein the electrochromic layer system has a layer thickness of 500 nm to 1 mm.

9. The laminated glass pane according to claim 1, wherein the substrate glass contains 0.1 wt.-% to 6 wt.-% alkali element oxides and 8 wt.-% to 15 wt.-% $B_2O_3$.

10. The laminated glass pane according to claim 1, wherein the cover glass contains 0 wt.-% to 16 wt.-% alkali element oxides and 5 wt.-% to 20 wt.-% $B_2O_3$.

11. The laminated glass pane according to claim 1, wherein the mean coefficient of thermal expansion of the substrate glass is $25 \times 10^{-7}$ K$^{-1}$ to $80 \times 10^{-7}$ K$^{-1}$ and the mean coefficient of thermal expansion of the cover glass is $25 \times 10^{-7}$ K$^{-1}$ to $80 \times 10^{-7}$ K$^{-1}$.

12. The laminated glass pane according to claim 1, wherein the absolute value of the difference is greater than zero and at most $12 \times 10^{-7}$ K$^{-1}$.

13. The laminated glass pane according to claim 1, wherein the absolute value of the difference is greater than zero at most $6 \times 10^{-7}$ K$^{-1}$.

14. The laminated glass pane according to claim 1, wherein the substrate glass and the cover glass have different thicknesses.

15. The laminated glass pane according to claim 14, wherein the substrate glass comprises a composition comprising 0 wt % to 16 wt % alkali element oxides and 5 wt % to 20 wt % $B_2O_3$, wherein the cover glass comprises a composition comprising 0 wt % to 16 wt % alkali element oxides and 5 wt % to 20 wt % $B_2O_3$, and wherein the substrate glass and the cover glass have different compositions.

16. The laminated glass pane according to claim 1, wherein laminated glass pane has an area of 0.48 m$^2$ to 3.75 m$^2$.

17. The laminated glass pane according to claim 1, wherein one of the substrate glass and the cover glass is a relatively thinner glass pane, and the other of the substrate glass and the cover glass is a relatively thicker glass pane, wherein a thickness of the relatively thinner glass pane divided by a thickness of the relatively thicker glass pane is in a ratio of 0.25 to 0.6.

18. The laminated glass pane according to claim 1, wherein maximum deflection in the temperature range from −40° C. to +90° C. of the laminated glass pane is in a range from 6.1 mm to 14 mm.

19. A laminated glass pane, comprising:
- a substrate glass having a thickness of 1.5 mm to 6 mm;
- at least one layer structure applied to the substrate glass, wherein the at least one layer structure contains an electrochromic layer, wherein the electrochromic layer has a thickness between 500 nm and 1 mm;
- at least one polymer layer applied to the at least one layer structure, the at least one polymer layer having a layer thickness of 0.2 mm to 10 mm; and
- a cover glass on the at least one polymer layer, the cover glass having a thickness of 1.5 mm to 10 mm, wherein:
- an absolute value of a difference between a mean coefficient of thermal expansion of the substrate glass and a mean coefficient of thermal expansion of the cover glass is greater than zero and at most $18 \times 10^{-7}$ $K^{-1}$;
- the maximum mechanical stress of the laminated glass pane in a temperature range from −40° C. to +90° C. is less than or equal to 7 MPa;
- a thickness of the substrate glass divided by a thickness of the cover glass is in a range of 0.25 to 0.6; and
- the laminated glass pane has an area in a range of 0.48 $m^2$ to 3.75 $m^2$.

* * * * *